United States Patent
Bromberger (10) Patent No.: US 7,601,584 B2
(45) Date of Patent: Oct. 13, 2009

(54) SEMICONDUCTOR ARRAY AND METHOD FOR MANUFACTURING A SEMICONDUCTOR ARRAY

(75) Inventor: Christoph Bromberger, Heilbronn (DE)

(73) Assignee: ATMEL Germany GmbH, Heilbronn (DE)

( * ) Notice: Subject to any disclaimer, the term of this patent is extended or adjusted under 35 U.S.C. 154(b) by 0 days.

(21) Appl. No.: 11/266,210

(22) Filed: Nov. 4, 2005

(65) Prior Publication Data
US 2006/0097243 A1 May 11, 2006

(30) Foreign Application Priority Data
Nov. 5, 2004 (DE) .................. 10 2004 053 394

(51) Int. Cl.
*H01L 21/76* (2006.01)
(52) U.S. Cl. .................. 438/235; 257/E21.383
(58) Field of Classification Search .................. 257/19, 257/47, 197, 205, 273, 351, 370, 477, 517, 257/E29.027–E29.028, E29.066–E29.067, 257/E29.194–E29.202, E21.383; 438/234, 438/E21.383
See application file for complete search history.

(56) References Cited

U.S. PATENT DOCUMENTS

| | | | |
|---|---|---|---|
| 5,424,227 A | | 6/1995 | Dietrich et al. |
| 5,459,084 A | | 10/1995 | Ryum et al. |
| 5,773,350 A | * | 6/1998 | Herbert et al. .................. 438/364 |
| 6,100,152 A | | 8/2000 | Emons et al. |
| 6,117,744 A | * | 9/2000 | Ammo .................. 438/309 |
| 6,239,477 B1 | | 5/2001 | Johnson |
| 6,384,469 B1 | | 5/2002 | Chantre |
| 6,465,317 B2 | * | 10/2002 | Marty .................. 438/321 |
| 6,518,111 B1 | | 2/2003 | Johnson |
| 6,869,854 B2 | * | 3/2005 | Cantell et al. .................. 438/368 |
| 2002/0168829 A1 | | 11/2002 | Bock et al. |
| 2002/0197809 A1 | | 12/2002 | Asai et al. |
| 2004/0014271 A1 | | 1/2004 | Cantell et al. |

(Continued)

FOREIGN PATENT DOCUMENTS

DE 33 04 642 A1 8/1984

(Continued)

OTHER PUBLICATIONS

D. Knoll et al., "*A Flexible, Low-Cost, High-Performance SiGe: C BiCMOS Process with a One-Mask HBT Module*," IEEE-IEDM 2002, Article 31.6.1, pp. 783-786.

(Continued)

*Primary Examiner*—Brook Kebede
*Assistant Examiner*—Tony Tran
(74) *Attorney, Agent, or Firm*—Muncy, Geissler, Olds & Lowe, PLLC (57) ABSTRACT

A method for manufacturing a semiconductor array, particularly a high-frequency bipolar transistor, is provided, the method includes process steps, so that a dielectric is produced on a mono-crystalline, first semiconductor region of a first conductivity type, a silicide layer is deposited and patterned in such a way that the silicide layer is insulated from the first semiconductor region by the dielectric, and, to form a base region, a second semiconductor region of a second conductivity type is applied to the first semiconductor region and to the silicide layer in such a way that the second semiconductor region lies with a first interface on the first semiconductor region and with a second interface on the silicide layer.

17 Claims, 4 Drawing Sheets

U.S. PATENT DOCUMENTS

2005/0023642 A1 2/2005 Heinemann et al.
2007/0241428 A1* 10/2007 Greenberg et al. .......... 257/587

FOREIGN PATENT DOCUMENTS

| DE | 43 01 333 A1 | 7/1994 |
| DE | 198 45 790 A1 | 3/2000 |
| DE | 101 60 509 A1 | 6/2003 |
| DE | 102 54 663 A1 | 6/2004 |
| EP | 0605920 * | 12/1993 |
| EP | 0 605 920 A1 | 7/1994 |
| EP | 0 709 894 A1 | 5/1996 |
| EP | 0 942 467 A1 | 9/1999 |

OTHER PUBLICATIONS

H. Ruecker et al., "*SiGe: C BiCMOS Technology with 3.6 ps Gate Delay,*" IEEE-IEDM 2003, Technical Digest, Article 5.3.1, (4 pages).
D. Widmann et al., "*Technologie hochintegrierter Schaltungen,*" Springer, $2^{nd}$ Edition, 1996, ISBN 3-540-59357-8, pp. 66-67.

* cited by examiner

SEMICONDUCTOR ARRAY AND METHOD FOR MANUFACTURING A SEMICONDUCTOR ARRAY

This nonprovisional application claims priority under 35 U.S.C. § 119(a) on German Patent Application No. DE 102004053394.6, which was filed in Germany on Nov. 5, 2004, and which is herein incorporated by reference.

BACKGROUND OF THE INVENTION

1. Field of the Invention

The present invention relates to a semiconductor array and to a method for manufacturing a semiconductor array.

2. Description of the Background Art

DE 43 01 333 A1, which corresponds to U.S. Pat. No. 5,424,227, discloses different process steps in a manufacturing process for an NPN-silicon-germanium heterobipolar transistor with a P-silicon-germanium base layer. Reference is made to the entire scope of this publication and the process steps in FIGS. 1a to 1h are explained.

Figure 1A:
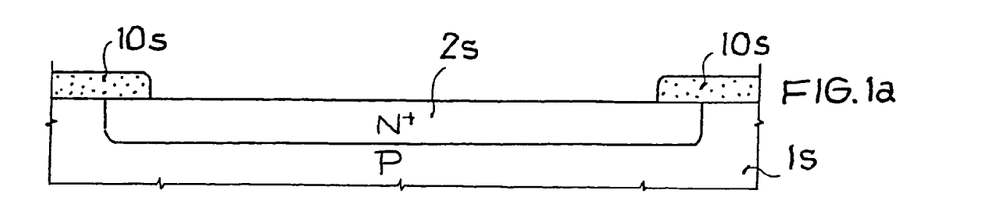
FIGS. 1a to 1h is a schematic drawing of a manufacturing process for an HBT according to the conventional art.

FIG. 1a: On the surface of a P-doped silicon substrate wafer 1s, a (masking) oxide layer 10s is formed by thermal oxidation and patterned with photoresist; an N$^+$ collector connection layer 2s ("buried layer") is formed by implantation and post-diffusion of arsenic ions.

Figure 1B:
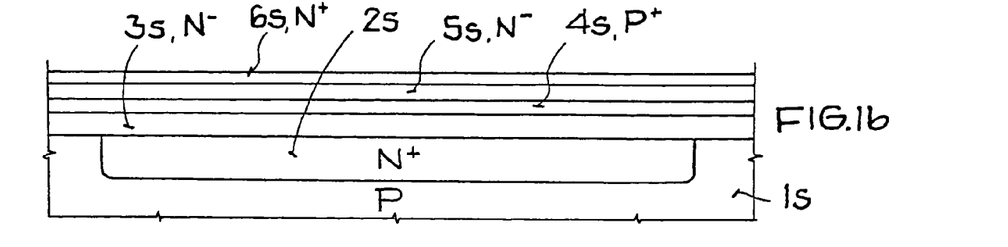

FIG. 1b: After removal of the masking oxide layer 10s, the layer sequence of the SiGe HBT is grown in a single process (for example, using molecular beam epitaxy MBE) without interruption, with simultaneous doping of the layers. The layer sequence comprises the N$^-$ collector layer 3s (for example, with a layer thickness of 300 nm and a doping concentration of $10^{16}$ to $10^{17}$ cm$^{-3}$), the P$^+$ SiGe base layer 4s (germanium proportion of, for example, 20%, layer thickness of 50 nm, and doping concentration of $10^{19}$ cm$^{-3}$), the N$^-$ emitter layer 5s (for example, with a layer thickness of 100 nm and a doping concentration of $10^{18}$ cm$^{-3}$), and the N$^+$ emitter contact layer 6s (for example, layer thickness of 50 nm and doping concentration exceeding $10^{20}$ cm$^{-3}$).

Figure 1C:
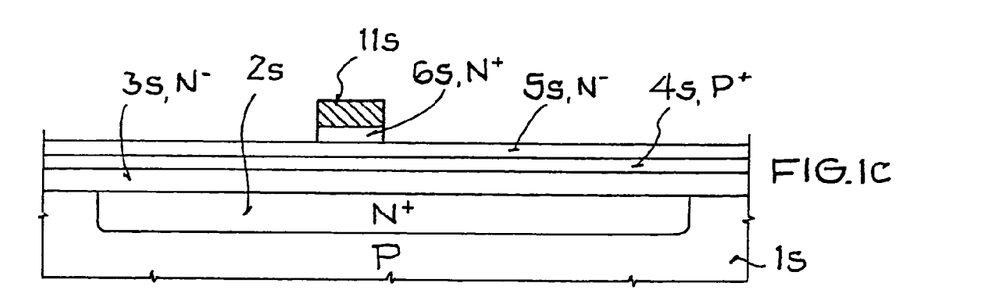

FIG. 1c: An auxiliary layer 11s (for example, of silicon nitride Si$_3$N$_4$) is deposited over the full surface of the N$^+$ emitter contact layer 6s (for example, by a CVD method), with a layer thickness of approximately 0.3 μm and patterned with photoresist; part of the Si$_3$N$_4$ auxiliary layer 11s and the Si emitter contact layer 6s is etched off anisotropically—the emitter layer 5s continues to remain above the SiGe base layer 4s.

Figure 1D:
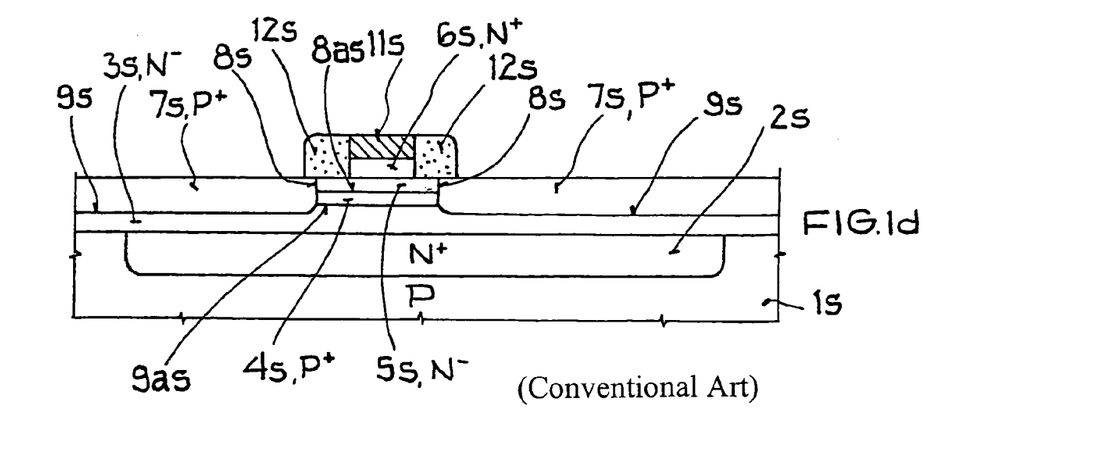

FIG. 1d: A CVD oxide (TEOS) 12s (for example, having a layer thickness of 0.3 μm) is conformally deposited over the surface of the semiconductor array and etched back anisotropically in such a way that an oxide layer 12s (spacer) remains only at the vertical edges of the auxiliary layer 11s and of the emitter contact layer 6s, and the remaining surface (for the base connection) is exposed; BF2 ions (dose, for example, $4\times10^{15}$ cm$^{-2}$, acceleration voltage, for example, 40-80 kV) are implanted in the exposed surface to a depth just below the SiGe base layer 4s and hence the emitter region 5s at the side of the oxide spacer 12s is redoped to provide the P$^+$ base connection region 7s, and the base collector PN junction 9s is moved to underneath the base/collector interface 9as, and the emitter/base/PN junction 8s to underneath the spacer oxide layer 12s.

Figure 1E:
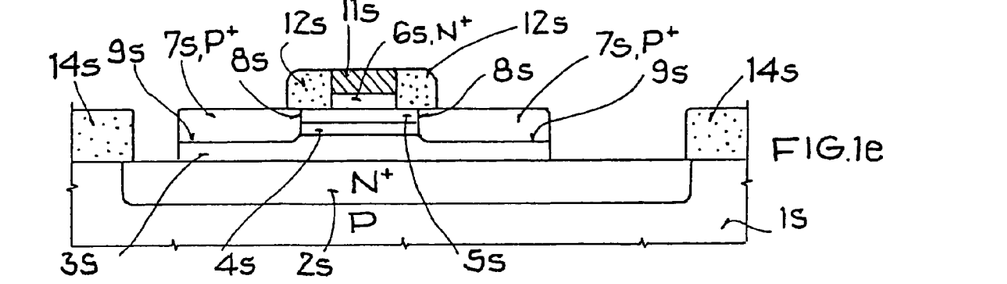

FIG. 1e: The final mesa-type structure is formed by the base connection region 7s and the collector layer 3s is patterned by anisotropic etching; by deposition and patterning of a CVD oxide (layer thickness, for example, 0.5 μm), field oxide regions 14s are formed that separate the various elements or active structures of the integrated circuit from one another.

Figure 1F:
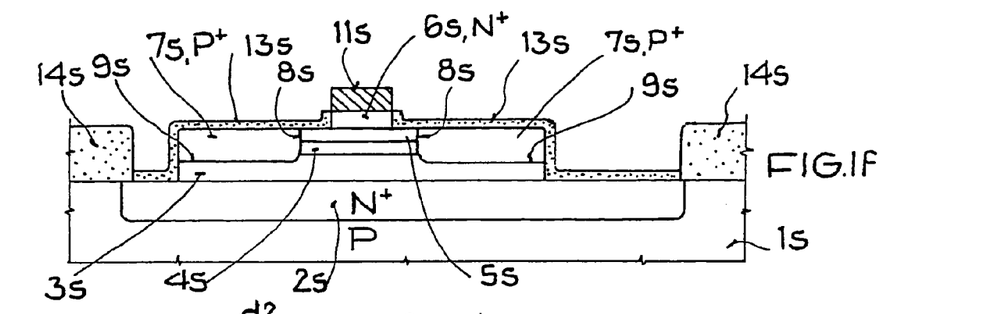

FIG. 1f: By thermal oxidation at a temperature of, for example, 700° C., the exposed surface of the semiconductor array is covered with an SiO$_2$ layer 13s with a thickness of, for example, 10 nm. Both the base/emitter/PN junction 8s and the collector/base/PN junction 9s are passivated on the surface and hence protected from leakage currents.

Figure 1G:
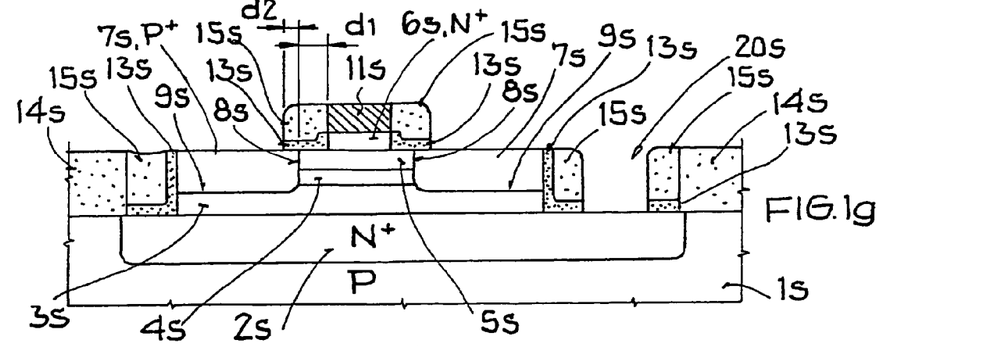

FIG. 1g: A CVD oxide 15s (TEOS) is deposited over the entire surface of the semiconductor array (for example, with a layer thickness of 0.5 μm) and etched back anisotropically in such a way that, on the one hand, the collector contact opening 20s is formed and, on the other, oxide spacers 15s remain, which protect the surface of the base/emitter/PN junction 8s over a length d$_2$. The distances d$_1$ (from the edge of the emitter contact layer 6s to the base connection region 7s) and d$_2$ (from the base connection region 7s to the later base metal layer 16s) are self-aligned and minimal thanks to the spacer technique described and use of the oxide layers 12s and 15s.

Figure 1H:
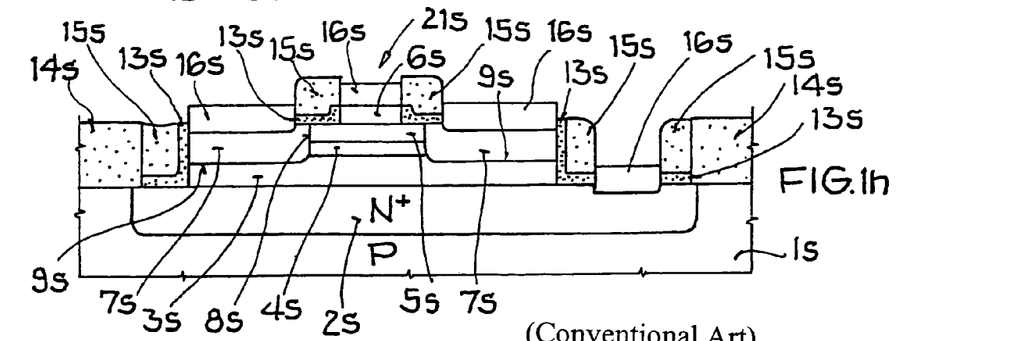

FIG. 1h: The remainder of the Si$_3$N$_4$ auxiliary layer 11s is removed, and the emitter contact opening 21s is exposed. By vapor deposition of a metal layer 16s (for example, titanium) and temperature treatment of said layer, a metal silicide (for example, titanium silicide) is formed on the surface of the silicon areas 2s, 6s, 7s, whereas the pure metal remains on the surface of the oxide areas 13s, 14s, 15s; the metal layer above the oxide areas 13s, 14s, 15s is selectively removed using an etchant solution. It is then possible, after application of an oxide layer and the manufacture of contact openings for emitter, base, and collector, to apply a metallized layer using conventional methods. SiGe HBTs of this type of FIG. 1h, however, can be produced not only on simply patterned substrates as described, but also, for example, on substrates already containing finished components in pure silicon technology (e.g., MOS or bipolar).

The base of the previously described transistor can be conceptually subdivided into an intrinsic base and an extrinsic base. The intrinsic base with the adjacent emitter and collector regions forms level and substantially parallel pn junctions, whereas the extrinsic base is made to provide the electrical connection of the intrinsic base to at least one external contact.

For many applications of bipolar transistors, thus, for example, for high-frequency power amplification, the base resistance is an important parameter, which limits the electrical properties of the transistors, particularly their cutoff frequency. Frequently, the base resistance is dominated by the resistance of the extrinsic base.

To reduce the resistance of the extrinsic base, the extrinsic base in a high-doped semiconductor material is made of the same type of dopant as the intrinsic base, but with a much greater layer thickness, in order to achieve a low layer resistance in this way. In the method taught by the publication "IEEE-IEDM 2002, Article 31.6.1, " for example, the extrinsic base is made of polysilicon with a layer thickness that is far greater than the width of the intrinsic base. Moreover, the extrinsic base can be made as a high-doped implanted region.

In order to reduce the resistance of the extrinsic base of bipolar transistors in silicon technology, the extrinsic base is silicidized, as set forth, for example, in the publications U.S. Pat. No. 5,459,084, U.S. Pat. No. 6,177,717, US 2002/0168829, or U.S. Pat. No. 6,465,317. Here, a layer of a metal capable of reacting with silicon is applied to the extrinsic base and said layer is caused to react with the silicon material of the extrinsic base. By annealing above the transformation point, the forming suicides are converted to a modification with a low specific resistance.

It is desirable for many applications, particularly in the high-frequency range, to introduce another semiconductor material, for example, germanium or carbon, in addition to silicon, into the intrinsic base of a bipolar transistor to manufacture a heterobipolar transistor. During the epitaxial deposition of the semiconductor material for the intrinsic base, the additional semiconductor material is also introduced into parts of the extrinsic base in addition to silicon. Germanium and carbon behave chemically like silicon, so that a metal capable of reacting with silicon also reacts with germanium or carbon under the same reaction conditions.

Particularly compounds of titanium and germanium exhibit a lower thermal stability than homologous compounds of titanium and silicon and dissociate at the transition point of the suicides. The germanium and titanium separation products formed during the dissociation act to increase the resistance.

In the presence of another semiconductor material (germanium) in the intrinsic base, it can therefore be desirable to carry out the silicidization reaction in such a way that the silicidation front does not penetrate deep into the intrinsic base. Nevertheless, a high silicide thickness is desirable to reduce base resistance.

As described previously in DE 43 01 333 A1, a thick emitter layer 5s is provided for this purpose, which has the function of keeping the silicon material available for a thick silicide layer 16s, without the silicidation front penetrating deep into the layer 4s of the silicon-germanium composition. A pn junction with a relatively large area is formed at the edge of the thick emitter area, the pn junction lying completely within the silicon. A relatively large silicon diode is connected in particular to the base/emitter diode of the heterobipolar transistor. This influences the electrical properties of the forming element and limits its geometric scaleability.

DE 198 45 790 A1 discloses a manufacturing process for SiGe heterobipolar transistors without large silicon edge transistors, in that for the wet-chemical thinning of silicon layers in the active emitter region of a bipolar transistor, additional doping, having a thickness less than 3 nm, introduced by means of "atomic layer doping" (ALD) in a cover layer, acts as an etch stop layer for wet-chemical etchant. The etch stop layer is subsequently removed with a wet-chemical etchant.

The layer growth of the cover layer occurs further above the etch stop layer as single crystals, so that with the aid of a silicon etchant, the single-crystal silicon of the cover layer can be removed highly selectively to the etch stop layer and to a dielectric. In an embodiment of the method of DE 198 45 790 A1, the epitaxial deposition of the thick emitter layer is interrupted by the application of the thin etch stop layer, for example, consisting of high-p-doped silicon, which acts as an etch stop, at the site of the emitter window during selective, wet-chemical thinning of the thick emitter layer for deepening the emitter window.

The publication "IEEE IEDM 2003, Technical Digest, Article 5.3.1" also describes a manufacturing method with relatively large edge transistors in which a high silicide thickness is achieved on the extrinsic base, whereas simultaneously the silicidation front above the germanium-containing layer is brought to a standstill. To that end, after the completion of the emitter contact, the silicon material is deposited exclusively above the extrinsic base by selective epitaxy and then silicidized.

A further disadvantage of the prior art arises from the fact that a silicide-silicon interface, forming during the silicidation, is generally formed unevenly. There is the particular risk of the formation of needle-shaped or pyramidal silicide crystallites, which project into the silicon area. To avoid a short circuit ("spike") between the silicide layer on the extrinsic base and the emitter region, accordingly, a sufficient lateral distance must be provided between the silicide edge and the emitter edge. As a result, the bulk resistance of the extrinsic base is detrimentally increased.

In particular, in the methods as taught in the publications U.S. Pat. No. 6,518,111 and U.S. Pat. No. 6,239,477, it is endeavored to reduce the base bulk resistance portion due to the non-silicidized region of the extrinsic base. In this regard, a large minimum distance is maintained between the emitter window and the extrinsic base to prevent base-emitter short circuits through laterally growing silicide crystals, the so-called spikes. To reduce the resistance, the region of the extrinsic base, which is situated between the silicide and the intrinsic base, is doped as highly as possible by dopants from a solid dopant source, without detrimentally affecting the properties of the base/emitter PN junction.

U.S. Pat. No. 6,518,111 provides a dielectric diffusion source layer (borosilicate glass) as a dopant source to reduce the layer resistance of the contact region between the intrinsic base and an extrinsic base of polysilicon, whereas U.S. Pat. No. 6,239,477 provides doping between the intrinsic base and a silicidized extrinsic base. US 2004/0014271 provides a selectively epitaxially deposited, highly doped silicon layer as the solid source.

SUMMARY OF THE INVENTION

It is therefore an object of the present invention to reduce the base resistance as much as possible, with the disadvantages of large lateral expansion and the effects of parasitic edge transistors, which can form between contact regions, being reduced to the greatest extent possible.

Accordingly, a method for manufacturing a semiconductor array is provided. Preferably, an integrated high-frequency circuit with high-frequency bipolar transistors or high-frequency bipolar transistors as single components are manufactured.

In this manufacturing method, at least the following process steps occur in the listed sequence; here, a sequence is not understood to be a stringent succession, so that other process steps, such as lithographic process steps, cleaning steps, etc., can occur between the process steps of the invention as listed in the sequence.

First, a dielectric is produced on a monocrystalline, first semiconductor region of a first conductivity type. The monocrystalline semiconductor region is advantageously a silicon substrate with preferably a <100> orientation.

A silicide layer is deposited and patterned in such a way that the silicide layer is insulated from the first semiconductor region by the dielectric. The silicide layer can thereby be preferably deposited by sputtering a suicide target. Alternatively, for depositing the silicide layer, a silicon layer and a metal layer, for example, titanium, cobalt, or tantalum, can be deposited and caused to react with one another.

To form a base region, a second semiconductor region of a second conductivity type, opposite to the first conductivity type, is applied to the first semiconductor region and to the silicide layer. The application occurs in such a way that the second semiconductor region lies with a first interface on the first semiconductor region and with a second interface on the silicide layer. Because the second semiconductor region is applied to the silicide layer to form the base region, the base can be connected from underneath, in that the size of the second interface decisively influences the contact resistance between the semiconductor material of the second semiconductor region of the base and the silicide layer.

The contact resistance between the silicide layer and the semiconductor material of the second semiconductor region significantly shapes the base resistance and thereby the high-frequency response of the semiconductor array. The connection of the base by the silicide layer placed below the semiconductor material, moreover, enables free spaces for process design of the functional layer(s) of the semiconductor array, placed above the second semiconductor region of the base.

Before the production of the dielectric, a hard mask can be produced on a first silicon surface of the first semiconductor region and parts of the first semiconductor region, not covered by the hard mask, are selectively removed. This enables placing the silicide layer to the side of the active collector-base region with the collector-base space-charge zone, and making the second semiconductor region substantially planar. Moreover, the selective removal of parts of the first semiconductor region may be utilized advantageously to form a trench structure, which enables a distancing of the first semiconductor region from the connection regions of the base. The aim is to reduce a parasitic capacitance between the first semiconductor region, which advantageously functions as a collector, and the base.

It is advantageous in an embodiment of the invention that the dielectric is produced by thermally oxidizing the surface, exposed after the selective removal, of the first semiconductor region and/or depositing one or more dielectric layers. The thermal oxide or the deposited dielectric layers can, moreover, be advantageously patterned afterwards.

In an embodiment of the invention, the thermal oxide and/or one or more dielectric layers are applied and patterned before the application of the second semiconductor region.

Furthermore, it is advantageous to planarize the surface of the wafer to the hard mask and to remove the hard mask before applying the second semiconductor region. The planarization enables a substantially planar layout of the second semiconductor region and the additional layer applied thereon, to produce preferably substantially planar PN junctions.

A first embodiment variant of the invention provides that the surface of the wafer is planarized by chemical/mechanical polishing (CMP) of the wafer. In this embodiment variant, the hard mask can be used advantageously as a planarization stop.

A second, alternative embodiment variant of the invention provides a planarization of the surface of the wafer by spin coating a resist with a suitable surface tension and thereby forming a level surface. By dry etching the wafer is uniformly thinned preferably to the first silicon surface of the first semiconductor region. In this regard, for example, the etching can be carried out by time.

Further, a silicon-germanium layer can be applied epitaxially to form the second semiconductor region. Advantageously, the first conductivity type is the n-conductivity type and the silicon-germanium layer is p-doped, if particularly an npn-high-frequency bipolar transistor is to be manufactured. For a pnp transistor, the assignment is appropriately inverse, accordingly for a pnp transistor the first conductivity type would be the p-conductivity type and the silicon-germanium layer n-doped.

For an npn transistor, to form the second semiconductor region an n-doped silicon layer and on said layer a p-doped silicon-germanium layer are applied. In so doing, the silicon layer is redoped by an annealing step by dopants for the p-conductivity type, proceeding from the silicide layer acting as the dopant source.

In this regard, for example, boron or another dopant for silicon is introduced into the silicide layer beforehand, for example, implanted or added in situ during the deposition of the silicide layer. These foreign substances in the silicide layer act as dopants after their diffusion out into the n-doped silicon layer. Due to a higher dopant concentration of the outwardly diffused dopants of the p-conductivity type versus the dopant concentration of the dopants of the n-conductivity type, this silicon layer is redoped and thereby forms a low-resistance junction between the silicide layer and the silicon-germanium layer of the second semiconductor region.

The semiconductor material of the second semiconductor region can be deposited amorphously and caused to crystallize by solid phase epitaxy. The crystallization here occurs in such a way that the arising crystal structure, proceeding from a surface, acting as the crystallization nucleus, of the first semiconductor region, continues monocrystalline. The monocrystalline continuation of the crystal structure occurs here at least in the vertical direction. Advantageously, moreover, a measurable lateral monocrystalline continuation is achieved at least via the dielectric.

A different embodiment of the invention provides that the silicide layer can be made of boron-doped cobalt silicide, and above the material of the silicide layer, remaining after the planarization, at least part of the second semiconductor region, particularly its silicon material, is redoped by the diffusion of boron out of the cobalt silicide layer to the p-doped semiconductor material.

A further embodiment of the invention provides that a third semiconductor region of an intermediate base region and a fourth semiconductor region of another base region are applied above the second semiconductor region. Preferably, in so doing, the conductivity type of the first semiconductor region corresponds to the conductivity type of the third semiconductor region. Preferably, moreover, the conductivity type of the second semiconductor region corresponds to the conductivity type of the fourth semiconductor region. Another silicide layer is applied above the fourth semiconductor region of the additional base region.

In a further embodiment, after the application of the additional silicide layer, an opening can be created in the additional silicide layer by removing the additional silicide layer within the area of the opening. After this, an emitter region is formed within the opening. Preferably, the position of the opening here, relative to the position of the silicide layer and the position of the first semiconductor region, is aligned in such a way that the interfaces of the first semiconductor region to the second semiconductor region, of the second semiconductor region to the third semiconductor region, of the third semiconductor region to the fourth semiconductor region, and of the fourth semiconductor region to the emitter semiconductor region are arranged substantially vertically over one another and preferably parallel to one another.

Another embodiment of the invention provides that to apply the fourth semiconductor region of the additional base region, a silicon-germanium layer and a first silicon layer are applied; here, the first silicon layer is inserted between the silicon-germanium layer and the additional silicide layer, by applying the first silicon layer, before the application of the additional silicide layer, to a first surface of the silicon-germanium layer of the fourth semiconductor region of the additional base region.

A second silicon layer of the fourth semiconductor region can be inserted between the additional silicide layer and the first silicon layer by applying the second silicon layer to a second surface of the first silicon layer before the application of the additional silicide layer, the second silicon layer preferably having a higher dopant concentration than the first silicon layer.

A preferred embodiment of the invention provides that the opening, in which the emitter region is formed during the further course of the process, is produced with a depth of at least to the second surface of the first silicon layer or to the first surface of the silicon-germanium layer of the fourth semiconductor region of the additional base layer.

A further development of the invention provides that both in the silicide layer and in the additional silicide layer, foreign substances are introduced, which, for example, with the aid of an annealing step or several annealing steps are diffused at the same time into the adjacent second semiconductor region, and/or into the adjacent fourth semiconductor region and act as dopants of the same conductivity type in said two semiconductor regions.

Another aspect of the invention is a semiconductor array. The array can be manufactured, for example, according to the previously explained process steps.

The semiconductor array has a monocrystalline, first semiconductor region of a first conductivity type. This is, for example, an n-doped silicon substrate. Furthermore, the semiconductor array has a second semiconductor region of a second conductivity type, which is made monocrystalline at the interface to the first semiconductor region. Apart from additional monocrystalline regions, the second semiconductor region can also have polycrystalline or amorphous regions. Based on the different conductivity type, a PN junction forms at the interface.

A silicide layer of the semiconductor array has an interface to the second semiconductor region. The silicide layer can have one or more silicides, such as cobalt silicide, titanium silicide, or tantalum silicide. The interface can be made, for example, in a polycrystalline area of the second semiconductor region.

In this regard, both the first semiconductor region and the silicide layer are placed below the second semiconductor region and insulated from one another. The second semiconductor region forms a base region, which is connected by the adjacent silicide layer. Preferably, the base region is made substantially planar.

Preferably, the second semiconductor region has a SiGe layer. The germanium fraction in this case can vary over the thickness of the layer. The SiGe layer is also formed monocrystalline in the area of the interface to the first semiconductor region and preferably continues monocrystalline the crystal structure of the first semiconductor region.

Particularly in order to avoid a contamination of the epitaxy material by the transition metal portion of the silicide layer in an epitaxial depositing of the SiGe layer, an advantageous development of the invention provides that the second semiconductor region has a silicon layer between the SiGe layer and the interface to the silicide layer, whereby this silicon layer is produced preferably by solid phase epitaxy of amorphously deposited silicon, proceeding from the interface to the first semiconductor region as the crystallization nucleus.

To achieve a low contact resistance between the silicide layer and the silicon-germanium layer, another embodiment of the invention provides that the silicon layer, proceeding from the silicide layer acting as the dopant source, is doped with dopants of the same conductivity type as that of the silicon-germanium layer.

To connect the base within a metallization system, a metal contact is placed within an opening in the second semiconductor region on the silicide layer. This is particularly advantageous when a direct contact between the semiconductor material and the metal of the metal contact is to be avoided.

An alternative embodiment of the invention provides that to connect the base region, a metal contact is placed on the second semiconductor region. It is also possible to place the metal contact both on the silicide layer and on the semiconductor material of the second semiconductor region.

Another aspect of the invention is the use of a previously explained semiconductor array in a high-frequency semiconductor component, for example, in a high-frequency bipolar transistor and/or in a vertically integrated high-frequency cascode array of an integrated circuit.

Another aspect of the invention is a semiconductor array having a first base region and a second base region. In this case, the two base regions are spaced apart from one another. To connect the first base, a first silicide layer is placed below the first base region, which adjoins said first base region. To connect the second base, a second silicide layer is placed above the second base region, which adjoins said second base region.

This different connection of the two bases in each case enables optimized electrical properties of the connections and also as independent a process integration of the connections as possible.

In developing this aspect of the invention further, it is provided that the first base region and the second base region are spaced apart vertically from one another by an intermediate base region. The intermediate base region, in this case, is of a first conductivity type, for example, an n-conductivity type, and the two base regions are of a second conductivity type, for example, a p-conductivity type. Thereby, both the first base region and the second base region are adjacent to the intermediate base region.

The first base region and/or the second base region can have a semiconductor region with a silicon-germanium layer. Preferably, this silicon-germanium layer here is placed separated from a silicide layer by a silicon layer.

The first base region and the second base region can be made substantially planar and parallel to one another. Advantageously, moreover, the lattice structure of the semiconductor material of the first base region is continued monocrystalline by the lattice structure of the intermediate base region and of the second base region, so that preferably the space-charge zones, associated with the two base regions, of the PN junctions are placed within the monocrystalline lattice structure.

A different aspect of the invention is a use of a previously described semiconductor array in a vertically integrated cascode array, particularly a high-frequency circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 2:
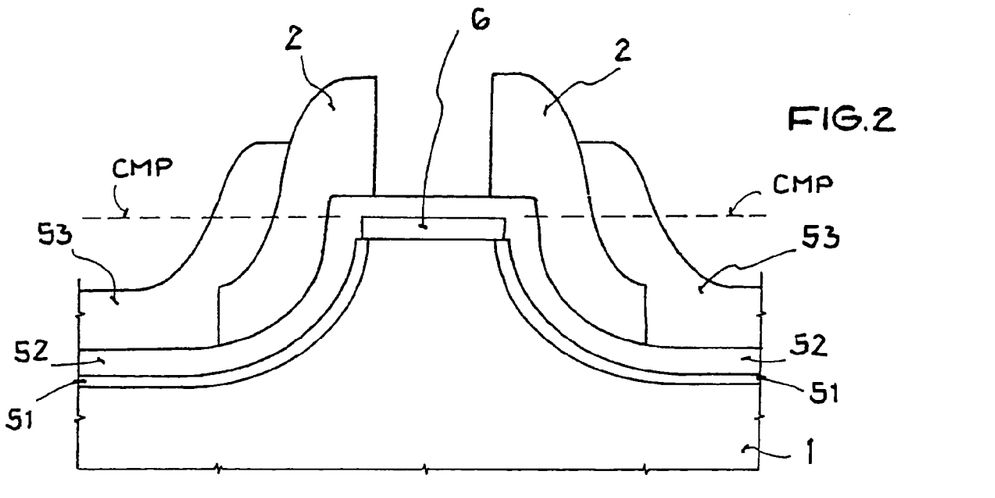
FIG. 2 is a schematic sectional view through a wafer structure before planarization.

A schematic sectional view through a wafer structure before a planarization step is shown in FIG. 2. A hard mask 6 of $Si_3N_4$ and of an underlying thermal oxide is applied to an already patterned first (n-doped) semiconductor region 1, which forms a collector region. Furthermore, a thermal oxide 51 ($SiO_2$) is formed and a first dielectric layer 52 is deposited. A silicide layer 2 and a second dielectric layer 53 are deposited on the first deposited, dielectric layer 52 and subsequently patterned. By a planarization step, the shown multilayer structure is to be planarized to the dashed line (CMP). A chemical/mechanical polishing step (CMP), for example, can be used for this.

Figure 3:
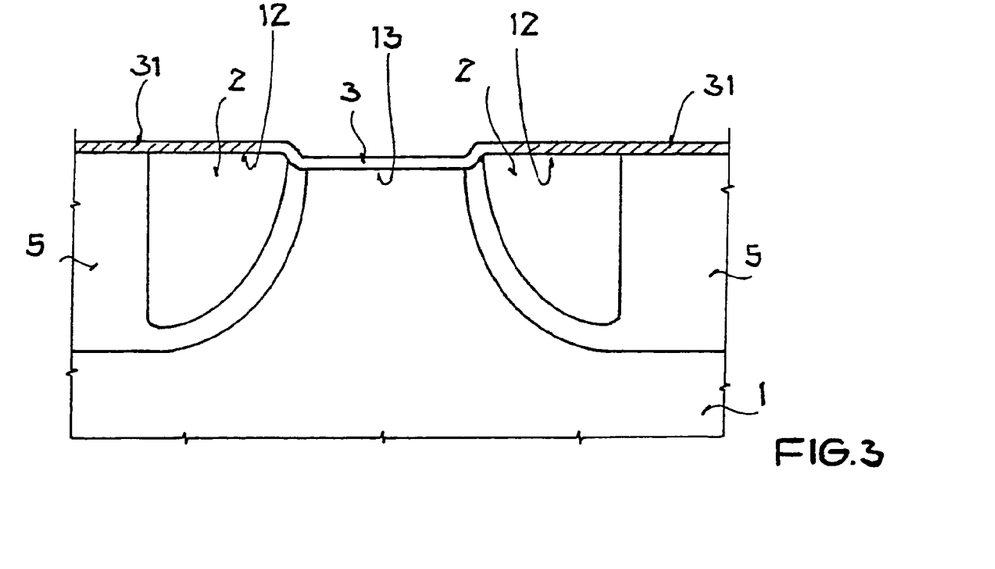
FIG. 3 is a schematic sectional view through a wafer structure after planarization and application of a silicon-germanium layer.

An exemplary embodiment of the invention after additional process steps is shown in FIG. 3. After the completed planarization, a second (p-doped) semiconductor region 3 with a silicon-germanium layer is applied, which has a first interface 13 to the first semiconductor region and an interface 12 to suicide layer 2. Within the area of first interface 13, the silicon-germanium layer of the second semiconductor region 3 continues the monocrystalline lattice structure of the first semiconductor region 1 in the vertical direction, and in a lateral region also in a lateral direction. The monocrystalline crystallization in the lateral direction is achieved in this case by solid phase epitaxy. At least in the area of another interface to dielectric 5, the second semiconductor region has polycrystalline or amorphous layer areas 31.

Figure 4:
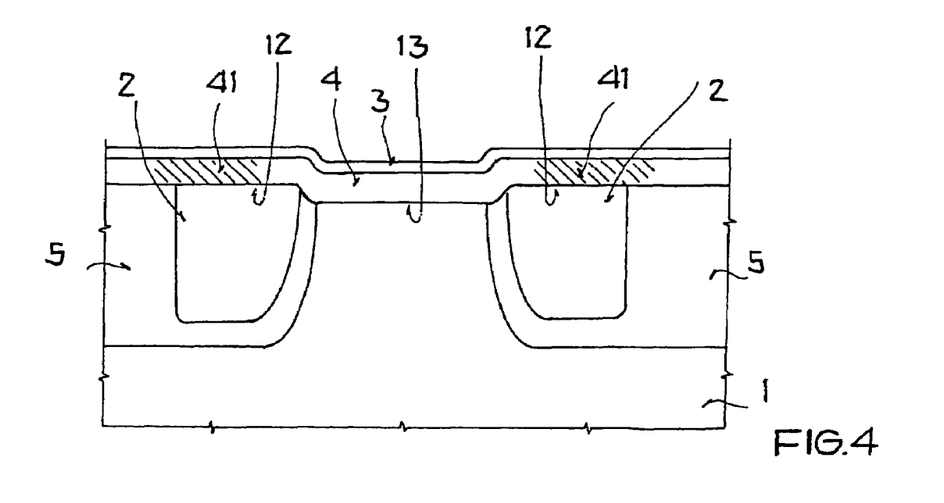
FIG. 4 is a schematic sectional view through a wafer structure after planarization and application of a silicon layer and a silicon-germanium layer.

FIG. 4 shows a schematic sectional view of another exemplary embodiment of the invention. Here, the second semiconductor region 3, 4 includes silicon-germanium layer 3 and silicon layer 4 placed below silicon-germanium layer 3, both of which continue the monocrystalline metal lattice of the first semiconductor region.

Silicon layer 4 is applied first weakly n-doped and redoped in the area of silicide layer 2 in a p-doped region. The redoping can be undertaken, for example, proceeding from silicide layer 2 as a solid source; for this purpose, for example, boron can be introduced into the silicide layer 2 in situ during the production or by implantation. In order to apply silicon layer 4, for example, a solid phase epitaxy can be used by depositing first a relatively thin (for example, 40 nm) amorphous, weakly n-doped silicon layer, followed by a relatively thick (for example, 300 nm), highly n-doped, amorphous silicon layer. Under the effect of temperature, proceeding from interface 13 to first semiconductor region 1, the amorphous areas above interface 13 are crystallized monocrystalline vertically, as well as partly the area above interface 12 in a lateral direction, by solid phase epitaxy.

The highly n-doped silicon layer functions here to support the solid phase epitaxy in a lateral direction. After completed solid phase epitaxy, the highly n-doped silicon layer is removed by an etchant, which selectively removes highdoped silicon areas. Next, silicon layer 4 is superficially oxidized and the formed oxide layer is removed. The oxidation step here serves to clean the surface. Simultaneously, during the oxidation step, the boron atoms introduced into silicide layer 2 diffuse out into silicon layer 4. Remaining amorphous or arising polycrystalline regions of silicon layer 4 are indicated in FIG. 4 by the hatching.

Figure 5:
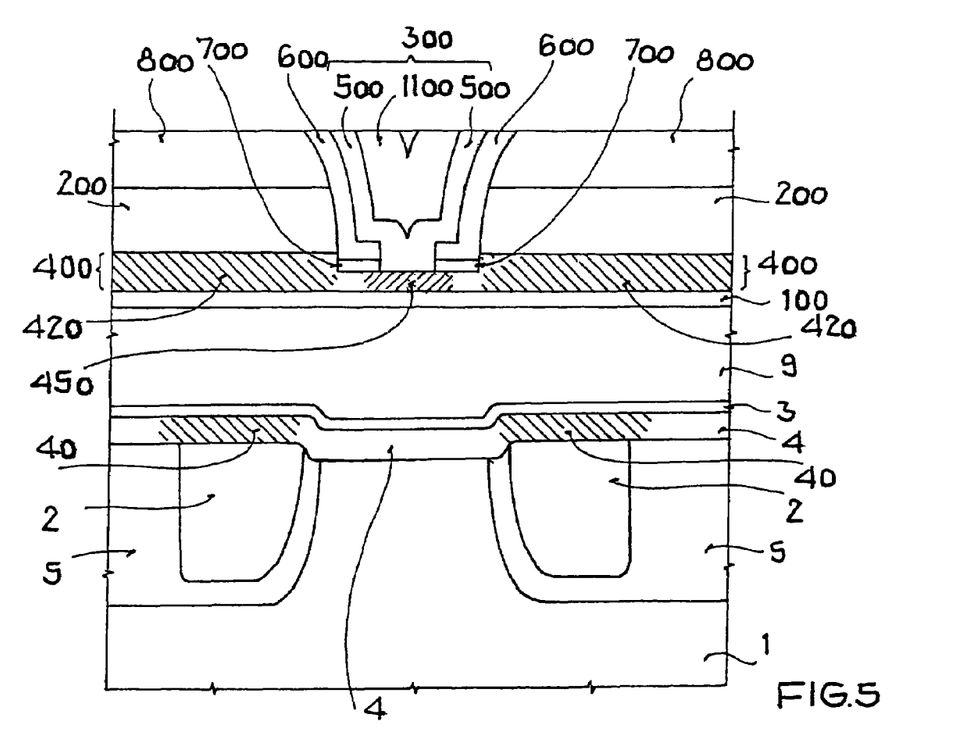
FIG. 5 is a schematic sectional view through a vertically integrated cascode array.

FIG. 5 shows a schematic sectional view through a vertically integrated cascode array, which preferably is used in a high-frequency circuit. The conductivity types for a highfrequency npnpn cascode apply to the following description. The collector region is formed by an n-doped layer 1, which may have a vertical doping gradient for a higher reverse voltage (not shown in FIG. 5).

To simplify the presentation, it is assumed in FIG. 5 that no amorphous or polycrystalline regions remain or arise in the solid phase epitaxy. The hatching in FIG. 5 therefore marks regions doped by diffusion out from neighboring regions.

A first base region (3, 4) with a first, p-doped silicongermanium semiconductor layer 3 and a second base region (100, 400) with a second, p-doped silicon-germanium layer 100 are provided. An n-doped intermediate base region (9), to which both base regions (3, 4, 100, 400) are adjacent and having a silicon layer, is placed between the first base region (3, 4) and the second base region (100, 400).

The second base region (100, 400) with silicon-germanium layer 100, which in this exemplary embodiment for a simpler presentation has only one layer (100) in the active region below the emitter, is placed above intermediate base region 9. Silicon layer 400, which in contrast to silicon-germanium layer 100 has no germanium, is placed on the second, p-doped silicon-germanium layer 100. Furthermore, a dielectric of a $Si_3N_4$ layer 800 is provided.

A silicide layer 200, in which an opening 300 is etched by a hard mask from $Si_3N_4$ layer 800 and the spacers, not shown in FIG. 5, is located above silicon layer 400 and thereby also above second base region 100, 400, the emitter region being formed within the opening 300 in subsequent steps. Opening 300, within which the emitter region (500, 1100) is located, thereby extends through the silicide layer 200.

Within opening 300, two internal spacers 600 are each located above thermal oxide 700. A polycrystalline or amorphous, $n^+$-(high) doped silicon 500, which also fills a spacer opening between two internal spacers 600, is applied adjacent to internal spacers 600. The remaining part of opening 300 of the emitter region is filled with a silicide 1100 and optionally other metallic conductors (not shown in FIG. 5).

Polysilicon 500, moreover, serves as a dopant source for doping monocrystalline semiconductor layer 400 in emitter region 450, which here is high $n^+$-doped by dopants from polysilicon 500 and forms active emitter region 450. Furthermore, silicide layer 200 acts as a dopant source, the silicon layer 400 in the area 420 of the extrinsic base being high $p^+$-doped. This enables an especially low-resistance connection of the extrinsic base (420, 100).

In regard to the areas lying below the n-doped silicon layer of the intermediate base region 9, reference is made to the embodiments in FIG. 4. For a simplified presentation, the necessary metal connections are not included in the shown sectional view in FIG. 5. These are preferably applied directly to the silicide layers (2, 200), so that these metals have an interface to silicide layers (2, 200) to be connected.

The production process for manufacturing the vertical semiconductor array has the following process steps, whereby the reference numbers refer to FIGS. 2 through 5:

Production of hard mask 6 on a first silicon surface of first semiconductor region 1, hard mask 6 covering collector region 1 of the collector layer;

Selective removal of the collector layer portions not covered by hard mask 6;

Thermal oxidation of the surface exposed after the selective removal of the collector layer;

Deposition of first dielectric layer 52;

Deposition and patterning of first silicide layer 2;

Deposition and patterning of second dielectric layer 53;

Planarization to the surface of hard mask 6 by removing the material of first dielectric layer 52, of first silicide layer 2, and of second dielectric layer 53;

Removal of hard mask 6;

Application of amorphous, n-doped silicon layer 4;

Crystallization of amorphous, n-doped silicon layer 4 by solid phase epitaxy, proceeding from the first silicon surface 13, exposed by removal of the hard mask 6, of the first semiconductor region 1 as the crystallization nucleus;

Epitaxial deposition of first monocrystalline semiconductor layer 3 of a second semiconductor region, first monocrystalline semiconductor layer 3 being formed preferably from first p-doped SiGe layer 3, Epitaxial deposition of a second, n-doped silicon layer of third semiconductor region 9;

Epitaxial deposition of a third and fourth monocrystalline semiconductor layer of fourth semiconductor region 100, the third monocrystalline semiconductor layer being formed preferably from a p-doped SiGe layer and the fourth semiconductor layer from weakly p-doped silicon;

Application of silicide layer 200 to the fourth semiconductor region (100, 400), the surface of said fourth semiconductor region (100, 400) forming a first semiconductor surface for the subsequent process steps;

Application of third dielectric layer 800;

Creation of an opening 300 in third dielectric layer 800 and in silicide layer 200, by which preferably the first semiconductor surface is exposed;

Creation of internal spacers 600 in opening 300; and

Formation of an emitter region (500, 1100) in opening 300.

Furthermore, it is advantageous to follow the crystallization of the amorphous, n-doped silicon layer by solid phase epitaxy with the following process steps:

Formation of another thermal oxide layer by partial oxidation of the crystallized n-doped silicon layer;

Selective redoping of the crystallized, n-doped silicon layer, remaining after the oxidation, by selective implantation of dopants of the p-dopant type in the silicon material above the first silicide layer material, remaining after the planarization step;

Healing of implantation damage by a thermal process; and

Removal of the additional thermal oxide layer.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for manufacturing a semiconductor array, the method comprising the steps of:

producing a dielectric on a mono-crystalline semiconductor region having a first conductivity type;

depositing a silicide layer and patterning the silicide layer so that the silicide layer is insulated from the mono-crystalline semiconductor region by the dielectric; and applying a semiconductor layer having a second conductivity type to the mono-crystalline semiconductor region and to the silicide layer, to form a base region, in such a way that the second semiconductor layer lies with a first interface on the mono-crystalline semiconductor region and with a second interface on the silicide layer, wherein, substantially the entirety of an upper surface of the silicide layer directly contacts a lower surface of the semiconductor layer, and wherein a plane formed by the upper surface of the silicide layer and a plane formed by the lower surface of the semiconductor layer are substantially parallel to a plane formed along the first interface where the semiconductor layer contacts the mono-crystalline semiconductor region.

2. The method according to claim 1, wherein one or more additional dielectrics are applied and patterned before the step of applying the semiconductor layer.

3. The method according to claim 1, wherein a surface of a structure formed before the step of applying is planarized to the hard mask and the hard mask is removed.

4. The method according to claim 3, wherein the silicide layer is made of boron-doped cobalt suicide and above material remaining after the planarization of the silicide layer, at least silicon material of the semiconductor layer is redoped by the diffusion of boron out of the cobalt suicide layer to the p-doped semiconductor material.

5. The method according to claim 1, wherein a surface of the structure is planarized by chemical/mechanical polishing (CMP) of the structure.

6. The method according to claim 1, wherein a surface of the structure is planarized by spin coating a resist with a suitable surface tension and thereby forming a level surface, and by dry etching the wafer is uniformly thinned preferably to the first silicon surface of the mono-crystalline semiconductor region.

7. The method according to claim 1, the first conductivity type is a n-conductivity type and a p-doped silicon-germanium layer is applied epitaxially to apply the semiconductor layer of the second conductivity type.

8. The method according to claim 1, wherein, to apply the semiconductor layer, an n-doped silicon layer and a p-doped silicon-germanium layer are applied, the n-doped silicon layer being redoped by an annealing step by dopants for the p-conductivity type proceeding from the silicide layer acting as a dopant source.

9. The method according to claim 1, wherein semiconductor material of the semiconductor layer is deposited amorphously and caused to crystallize by solid phase epitaxy in such a way that the arising crystal structure, proceeding from a surface, acting as the crystallization nucleus, of the mono-crystalline semiconductor region, continues to monocrystalline.

10. The method according to claim 1, wherein the semiconductor array is a high-frequency bipolar transistor.

11. The method according to claim 1, wherein the entire upper surface of the silicide layer directly contacts the lower surface of the semiconductor layer.

12. A method for manufacturing a semiconductor array, the method comprising the steps of:

producing a dielectric on a monocrystalline semiconductor region having a first conductivity type;

depositing a silicide layer and patterning the silicide layer so that the silicide layer is insulated from the mono-crystalline semiconductor region by the dielectric; and applying a semiconductor region layer having a second conductivity type to the mono-crystalline semiconductor region and to the silicide layer, to form a base region, in such a way that the semiconductor layer lies with a first interface on the mono-crystalline semiconductor region and with a second interface on the silicide layer, wherein, before the production of the dielectric, a hard mask is produced on a first silicon surface of the mono-crystalline semiconductor region and parts of the semiconductor region not covered by the hard mask are selectively removed.

13. The method according to claim 12, wherein the dielectric is produced by thermally oxidizing the surface, exposed after the selective removal of the mono-crystalline semiconductor region and/or depositing one or more dielectric layers.

14. A method for manufacturing a semiconductor array, the method comprising the steps of:

producing a dielectric on a mono-crystalline semiconductor region having a first conductivity type;

depositing a silicide layer and patterning the silicide layer so that the silicide layer is insulated from the mono-crystalline semiconductor region by the dielectric; and applying a first semiconductor layer having a second conductivity type to the mono-crystalline semiconductor region and to the silicide layer, to form a base region, in such a way that the first semiconductor layer lies with a first interface on the mono-crystalline semiconductor region and with a second interface on the silicide layer, wherein a second semiconductor layer of an intermediate base region and a third semiconductor layer of another base region are applied above the first semiconductor layer, wherein a second silicide layer is applied above the third semiconductor layer of the additional base region, wherein, after the application of the second silicide layer, an opening is created in the second silicide layer by removing the second silicide layer within the area of the opening, and wherein an emitter region is formed within the opening, and wherein both in the silicide layer and in the second silicide layer, foreign substances are introduced, which in an annealing step diffuse substantially simultaneously into the adjacent first semiconductor layer and/or into the adjacent third semiconductor layer and act as dopants of the same conductivity type in the first and third semiconductor layers.

15. The method according to claim 14, wherein, to apply the third semiconductor layer of the additional base region, a silicon-germanium layer and a first silicon stratum are applied, the first silicon stratum being inserted between the silicon-germanium layer and the second suicide layer, by applying the first silicon stratum before application of the second suicide layer, to a first interface of the silicon-germanium layer of the third semiconductor layer of the additional base region.

16. The method according to claim 15, wherein a second silicon stratum of the third semiconductor layer is inserted between the second suicide layer and the first silicon stratum by applying the second silicon stratum to a surface of the first silicon stratum before the application of the second suicide layer, the second silicon stratum preferably having a higher dopant concentration than the first silicon stratum.

17. The method according to claim 15, wherein the opening is produced with a depth of at least to the second interface of the first silicon stratum or to the first interface of the silicon-germanium layer of the third semiconductor layer of the additional base layer.

* * * * *